(12) United States Patent
Qian et al.

(10) Patent No.: US 12,066,722 B2
(45) Date of Patent: Aug. 20, 2024

(54) ARRAY SUBSTRATE AND DISPLAY PANEL

(71) Applicants: Beijing BOE Display Technology Co., Ltd., Beijing (CN); BOE Technology Group Co., Ltd., Beijing (CN)

(72) Inventors: Xueqiang Qian, Beijing (CN); Dongchuan Chen, Beijing (CN); Xinli Ma, Beijing (CN); Bingyang Liu, Beijing (CN); Tianyu Xu, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 97 days.

(21) Appl. No.: 17/771,243

(22) PCT Filed: Jun. 17, 2021

(86) PCT No.: PCT/CN2021/100613
§ 371 (c)(1),
(2) Date: Apr. 22, 2022

(87) PCT Pub. No.: WO2021/254435
PCT Pub. Date: Dec. 23, 2021

(65) Prior Publication Data
US 2022/0365396 A1  Nov. 17, 2022

(30) Foreign Application Priority Data
Jun. 18, 2020 (CN) .......................... 202010559469.4

(51) Int. Cl.
*G02F 1/1343* (2006.01)
*G02F 1/1335* (2006.01)
(Continued)

(52) U.S. Cl.
CPC .. *G02F 1/134345* (2021.01); *G02F 1/133512* (2013.01); *G02F 1/133707* (2013.01);
(Continued)

(58) Field of Classification Search
CPC ..................... G02F 1/133707; G02F 1/133512
See application file for complete search history.

(56) References Cited

U.S. PATENT DOCUMENTS

2007/0002247 A1\* 1/2007 Lee ................... G02F 1/134363
349/141
2013/0235315 A1 9/2013 Ito et al.
(Continued)

FOREIGN PATENT DOCUMENTS

| CN | 102156367 A | 8/2011 |
| CN | 103309089 A | 9/2013 |

(Continued)

OTHER PUBLICATIONS

Office Action dated Nov. 2, 2021, issued in counterpart to CN Application No. 202010559469.4, with Search Report and English Translation. (16 pages).

*Primary Examiner* — Jessica M Merlin
(74) *Attorney, Agent, or Firm* — WHDA, LLP

(57) ABSTRACT

An array base plate and a display panel. The array base plate includes a substrate and a plurality of sub-pixels that are provided on the substrate and are arranged in an array; each of the sub-pixels includes a first slit electrode (1) and a second slit electrode (2) that are arranged in a first direction the first slit electrode (1) includes a plurality of first slits (11) that are arranged parallelly and separately, and the second slit electrode (2) includes a plurality of second slits (21) that are arranged parallelly and separately, and a direction of extension of the first slits (11) and a direction of extension of the second slits (21) are different; and the sub-pixel further includes a dark-region light shielding part (6) located (Continued)

over the first slit electrode (1) and the second slit electrode (2).

16 Claims, 3 Drawing Sheets

(51) Int. Cl.
  *G02F 1/1337* (2006.01)
  *G02F 1/1362* (2006.01)
  *G02F 1/1368* (2006.01)
  *H01L 27/12* (2006.01)
(52) U.S. Cl.
  CPC .. *G02F 1/136209* (2013.01); *G02F 1/136286* (2013.01); *H01L 27/124* (2013.01); *G02F 1/13439* (2013.01); *G02F 1/1368* (2013.01)

(56) References Cited

U.S. PATENT DOCUMENTS

2015/0146127 A1    5/2015  Song et al.
2018/0107036 A1*  4/2018  Shao ..................... G02F 1/1343
2019/0353940 A1* 11/2019  Zhao ................. G02F 1/136286

FOREIGN PATENT DOCUMENTS

| CN | 206610047 U | | 11/2017 | |
|---|---|---|---|---|
| CN | 110928066 A | * | 3/2020 | ....... G02F 1/134309 |
| CN | 110928066 A | | 3/2020 | |
| CN | 111103734 A | | 5/2020 | |
| CN | 111580309 A | | 8/2020 | |

* cited by examiner

ARRAY SUBSTRATE AND DISPLAY PANEL

CROSS REFERENCE TO RELEVANT APPLICATIONS

The present disclosure claims the priority of the Chinese patent application filed on Jun. 18, 2020 before the Chinese Patent Office with the application number of 202010559469.4 and the title of "ARRAY SUBSTRATE AND DISPLAY PANEL", which is incorporated herein in its entirety by reference.

TECHNICAL FIELD

The present disclosure relates to the technical field of displaying, and more particularly, to an array base plate and a display panel.

BACKGROUND

Liquid-crystal display panels have occupied the major of the market in the field of displaying. Currently, the types of liquid-crystal display panels mainly include Twisted Nematic (TN) type, Vertical Alignment (VA) type, In-Plane Switching (IPS) type and Advanced Super Dimension Switch (ADS) type. Among them the ADS-type liquid crystal display panels are popular in the market due to the advantages such as a high resolution, a high transmittance, a low power consumption, a wide visual angle and a high aperture ratio.

SUMMARY

The embodiments of the present disclosure provide an array base plate and a display panel.

The embodiments of the present disclosure employ the following technical solutions:

In an aspect, there is provided an array base plate, wherein the array base plate includes a substrate and a plurality of sub-pixels that are provided on the substrate and are arranged in an array;

each of the sub-pixels includes a first slit electrode and a second slit electrode that are arranged in a first direction;

the first slit electrode includes a plurality of first slits that are arranged parallelly and separately, the second slit electrode includes a plurality of second slits that are arranged parallelly and separately, and a direction of extension of the first slits and a direction of extension of the second slits are different; and the sub-pixel further includes a dark-area light shielding part located over the first slit electrode and the second slit electrode, and an orthographic projection of the dark-area light shielding part on the substrate at least partially covers an orthographic projection of a first area of the sub-pixel on the substrate, wherein the first area is a area between the first slit electrode and the second slit electrode.

Optionally, a width of the dark-area light shielding part in the first direction is uniform.

Optionally, the width of the dark-area light shielding part in the first direction is less than or equal to a maximum width of the first area in the first direction.

Optionally, in the sub-pixel, an included angle between the direction of extension of the first slits and a second direction is a first included angle, and an included angle between the direction of extension of the second slits and the second direction is a second included angle, wherein the second direction and the first direction are perpendicular; and the maximum width of the first area in the first direction is of a positive correlation with the first included angle and the second included angle, respectively.

Optionally, a width of the dark-area light shielding part in the first direction is correlated with a width of the first slits, a distance between each of the adjacent first slits, a width of the second slits and a distance between each of the adjacent second slits.

Optionally, the orthographic projection of the dark-area light shielding part on the substrate further covers an orthographic projection of a second area of the sub-pixel on the substrate, wherein the second area includes areas where two ends of each of the first slits are located and areas where two ends of each of the second slits are located.

Optionally, the second area further includes areas between the same ends of each of the first slits and of each of the second slits and an edge of the adjacent sub-pixel.

Optionally, the sub-pixel further includes a planar electrode located under the first slit electrode and the second slit electrode.

Optionally, when the planar electrode is electrically connected to a common-electrode signal line, and the first slit electrode and the second slit electrode are electrically connected to a pixel-electrode signal line, the planar electrode is a common electrode, the first slit electrode and the second slit electrode are pixel electrodes, and the formed array base plate is an ADS-type array base plate.

Optionally, when the planar electrode is electrically connected to a pixel-electrode signal line, and the first slit electrode and the second slit electrode are electrically connected to a common-electrode signal line, the planar electrode is a pixel electrode, the first slit electrode and the second slit electrode are common electrodes, and the formed array base plate is an HADS-type array base plate.

In another aspect, there is provided a display panel, wherein the display panel includes a color-film base plate and the array base plate stated above which are arranged in align with each other, and a liquid-crystal layer located between the color-film base plate and the array base plate.

In yet another aspect, there is provided another display panel, wherein the display panel includes an array base plate and a color-film base plate which are arranged in align with each other;

the array base plate includes a substrate and a plurality of sub-pixels that are provided on the substrate and are arranged in an array, each of the sub-pixels includes a first slit electrode and a second slit electrode that are arranged in a first direction, the first slit electrode includes a plurality of first slits that are arranged parallelly and separately, the second slit electrode includes a plurality of second slits that are arranged parallelly and separately, and a direction of extension of the first slits and a direction of extension of the second slits are different; and the color-film base plate includes a black matrix, the black matrix includes a plurality of dark-area light shielding parts, and an orthographic projection of the dark-area light shielding part on the substrate at least partially covers an orthographic projection of a first area of the sub-pixel on the substrate, wherein the first area is an area between the first slit group and the second slit group.

Optionally, a width of the dark-area light shielding part in the first direction is less than or equal to a sum of an aligning deviation between the array base plate and the color-film base plate and a maximum width of the first area in the first direction.

Optionally, in the sub-pixel, an included angle between the direction of extension of the first slits and a second direction is a first included angle, and an included angle between the direction of extension of the second slits and the second direction is a second included angle, wherein the second direction and the first direction are perpendicular; and the maximum width of the first area in the first direction is in a positive correlation with the first included angle and the second included angle, respectively.

Optionally, the array base plate further includes a plurality of grid lines that are arranged in the first direction, and the grid lines are located between two adjacent rows of the sub-pixels in the first direction;

the black matrix further includes a grid-line light shielding part, and orthographic projections of the grid-line light shielding part on the substrate cover orthographic projections of the grid lines on the substrate; and a proportion of a width of the dark-area light shielding part in the first direction is less than or equal to one-half of a width of the grid-line light shielding part in the first direction.

Optionally, the width of the grid-line light shielding part in the first direction is greater than or equal to a width of the grid lines in the first direction.

Optionally, the orthographic projection of the dark-area light shielding part on the substrate further covers an orthographic projection of a second area of the sub-pixel on the substrate, wherein the second area includes areas where two ends of each of the first slits are located and areas where two ends of each of the second slits are located.

Optionally, the second area further includes areas between the same ends of each of the first slits and of each of the second slits and an edge of the adjacent sub-pixel.

Optionally, the array base plate further includes a plurality of data lines and thin-film transistors that are arranged in a second direction;

the data lines are located between two adjacent rows of the sub-pixels in the second direction, and the thin-film transistors are electrically connected to the first slit electrode and the second slit electrode; and the black matrix covers the data lines and the thin-film transistors.

The above description is merely a summary of the technical solutions of the present disclosure. In order to more clearly know the elements of the present disclosure to enable the implementation according to the contents of the description, and in order to make the above and other purposes, features and advantages of the present disclosure more apparent and understandable, the particular embodiments of the present disclosure are provided below.

BRIEF DESCRIPTION OF THE DRAWINGS

In order to more clearly illustrate the technical solutions of the embodiments of the present disclosure or the related art, the figures that are required to describe the embodiments or the related art will be briefly introduced below. Apparently, the figures that are described below are merely embodiments of the present disclosure, and a person skilled in the art may obtain other figures according to these figures without paying creative work.

DETAILED DESCRIPTION OF THE EMBODIMENTS

Figure 1:
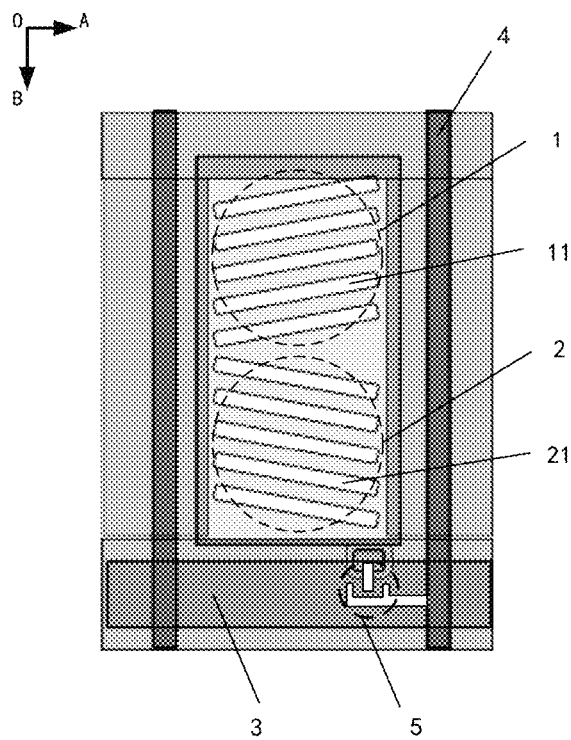
FIG. 1 is a schematic structural diagram of a first display panel according to an embodiment of the present disclosure.

The technical solutions of the embodiments of the present disclosure will be clearly and completely described below with reference to the drawings of the embodiments of the present disclosure. Apparently, the described embodiments are merely certain embodiments of the present disclosure, rather than all of the embodiments. All of the other embodiments that a person skilled in the art obtains on the basis of the embodiments of the present disclosure without paying creative work fall within the protection scope of the present disclosure.

In the embodiments of the present disclosure, terms such as "first" and "second" are used to distinguish identical items or similar items that have substantially the same functions and effects, merely in order to clearly describe the technical solutions of the embodiments of the present disclosure, and should not be construed as indicating or implying the degrees of importance or implicitly indicating the quantity of the specified technical features.

In the embodiments of the present disclosure, the meaning of "plurality of" is "two or more", unless explicitly and particularly defined otherwise.

In the embodiments of the present disclosure, the terms that indicate orientation or position relations, such as "upper", are based on the orientation or position relations shown in the drawings, and are merely for conveniently describing the present disclosure and simplifying the description, rather than indicating or implying that the device or element must have the specific orientation and be constructed and operated according to the specific orientation. Therefore, they should not be construed as a limitation on the present disclosure.

An embodiment of the present disclosure provides an array base plate, wherein the array base plate includes a substrate and a plurality of sub-pixels that are provided on the substrate and are arranged in an array. Referring to FIG. 1, each of the sub-pixels includes a first slit electrode 1 and a second slit electrode 2 that are arranged in a first direction. The first slit electrode 1 includes a plurality of first slits 11 that are arranged parallelly and separately, the second slit electrode 2 includes a plurality of second slits 21 that are arranged parallelly and separately, and the direction of extension of the first slits 11 and the direction of extension of the second slits 21 are different.

Figure 2:
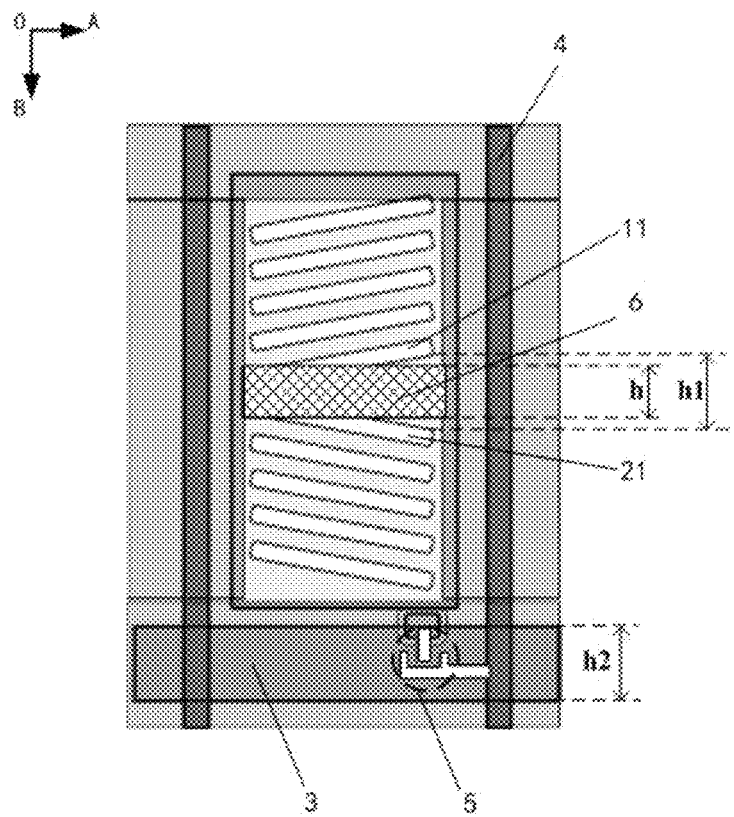
FIG. 2 is a schematic structural diagram of a second display panel according to an embodiment of the present disclosure.
Figure 5:
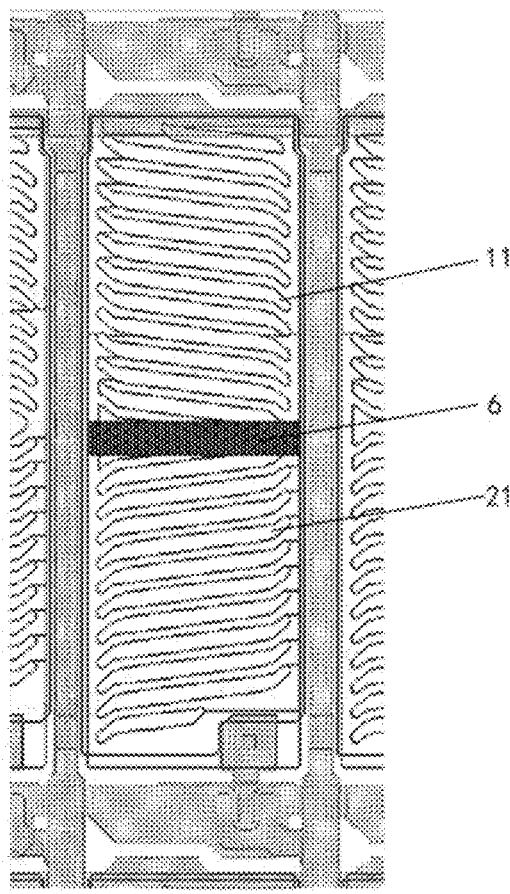
FIG. 5 is a layout of the display panel according to an embodiment of the present disclosure.

The sub-pixel further includes a dark-area light shielding part 6 located over the first slit electrode 1 and the second slit electrode 2. Referring to FIGS. 2 and 5, the orthographic projection of the dark-area light shielding part 6 on the substrate at least partially covers the orthographic projection of a first area of the sub-pixel on the substrate, wherein the first area is the area between the first slit electrode 1 and the second slit electrode 2.

It should be noted that, in order to clearly demonstrate the structures of the first slit electrode 1 and the second slit electrode 2, the dark-area light shielding part 6 is not illustrated m FIG. 1.

The sub-pixel is generally configured as strip-shaped. The first direction may be the direction OB shown in FIG. 1 (i.e., the direction of the longer sides of the sub-pixel), and may also be the direction OA shown in FIG. 1 (i.e., the direction of the shorter sides of the sub-pixel), which is not limited herein. FIG. 1 illustrates by taking the case as an example in which the first direction is the direction OB.

The plurality of sub-pixels that are arranged in an array may include red-color (R) sub-pixels, green-color (G) sub-pixels and blue-color (B) sub-pixels, and certainly, the plurality of sub-pixels may further include sub-pixels of other colors, such as yellow-color (Y) sub-pixels.

That the orthographic projection of the dark-area light shielding part 6 on the substrate at least partially covers the orthographic projection of the first area of the sub-pixel on the substrate refers to that the orthographic projection of the dark-area light shielding part 6 on the substrate may partially cover the orthographic projection of the first area of the sub-pixel on the substrate, and may also totally cover the orthographic projection of the first area of the sub-pixel on the substrate. In addition, due to the direction of extension of the first slits 11 and the direction of extension of the second slits 21 are different, the shape of the area between the first slit electrode 1 and the second slit electrode 2 is irregular, and accordingly, referring to FIG. 2, the orthographic projection of the dark-area light shielding part 6 on the substrate may partially cover the orthographic projections of the first slits 11 and the second slits 21 that are adjacent to the first area on the substrate.

The orthographic projection of the dark-area light shielding part 6 on the substrate refers to the projection of the dark-area light shielding part 6 on the substrate in the direction perpendicular to the substrate. The orthographic projection of the first area of the sub-pixel on the substrate refers to the projection of the first area of the sub-pixel on the substrate in the direction perpendicular to the substrate.

The material of the dark-area light shielding part 6 is not limited, as long as it is capable to shield light. As an example, the material of the dark-area light shielding part may be the same as the material of the black matrix.

The first slit electrode 1 and the second slit electrode 2 are electrically connected, and, in order to simplify the process, they may be manufactured by using a one-step patterning process. The quantity of the first slits 11 included in the first slit electrode 1 and the quantity of the second slits 21 included in the second slit electrode 2 are not limited herein.

The sub-pixel may further include a planar electrode located under the first slit electrode 1 and the second slit electrode 2. When the planar electrode is electrically connected to a common-electrode signal line, and the first slit electrode 1 and the second slit electrode 2 are electrically connected to a pixel-electrode signal line, the planar electrode is a common electrode, the first slit electrode 1 and the second slit electrode 2 are pixel electrodes, and the array base plate formed in this case is an ADS-type array base plate. When the planar electrode is electrically connected to a pixel-electrode signal line, and the first slit electrode 1 and the second slit electrode 2 are electrically connected to a common-electrode signal line, the planar electrode is a pixel electrode, the first slit electrode 1 and the second slit electrode 2 are common electrodes, and the array base plate formed in this case is an HADS-type array base plate. The type of the signal line electrically connected to the first slit electrode 1 and the second slit electrode 2 is not limited herein, and may be particularly determined according to practical demands.

When the array base plate is applied to a liquid-crystal display panel, after the first slit electrode 1, the second slit electrode 2 and the planar electrode are connected with a voltage, the first slit electrode 1 and the second slit electrode 2 generate an electric field at the edges of the slits, and at the same time, the first slit electrode 1 and the second slit electrode 2 generate an electric field with the planar electrode, respectively, thereby forming a multi-dimensional electric field, to drive the liquid-crystal molecules to rotate, to implement the displaying.

However, due to the direction of extension of the first slits 11 of the first slit electrode 1 and the direction of extension of the second slits 21 of the second slit electrode 2 are different in the sub-pixel, the liquid-crystal molecules corresponding to the area between the first slit electrode 1 and the second slit electrode 2. (i.e., the boundary area) may not be deviated to the suitable position. Therefore, the bright-state brightness of that area is obviously less than the bright-state brightness of the other areas, thereby forming a displaying dark area. However, the dark-state brightness of that area is equal to the dark-state brightness of the other areas.

In view of that, the array base plate is provided with the dark-area light shielding part, and the orthographic projection of the dark-area light shielding part on the substrate at least partially covers the orthographic projection of the first area of the sub-pixel on the substrate, thereby blocking at least part of the first area, which may increase the average brightness of the sub-pixel, while maintaining the dark-state average brightness unchanged. Moreover, the contrast is defined as the quotient obtained by dividing the bright-state average brightness by the dark-state average brightness, and accordingly the contrast of the liquid-crystal display panel comprising the above-described array base plate is greatly increased, to make a good effect of displaying, thereby satisfying the market requirements.

It should be noted that the array base plate may further include components such as the grid lines 3, the data lines 4 and the thin-film transistor 5 shown in FIG. 1. Merely the components and the film layers that are relevant to the inventiveness are described herein, and the other components may be obtained by referring to the related art, and are not discussed herein further.

In order to facilitate the manufacturing, optionally, referring to FIG. 2, the width h of the dark-area light shielding part 6 in the first direction (the direction OB in FIG. 2) is uniform. In this case, the dark-area light shielding part 6 is a throughout crossbar, to block the displaying dark area (also referred to as a weak-light-emission area) in the sub-pixel, thereby increasing the average brightness of the entire sub-pixel.

Optionally, referring to FIG. 2, the width h of the dark-area light shielding part 6 in the first direction (the direction OB in FIG. 2) is less than or equal to the maximum width h1 of the first area in the first direction (the direction OB in FIG. 2). That may ensure that the affection on the transmittance (Tr) is reduced to the largest extent while increasing the contrast (CR).

Figure 3:
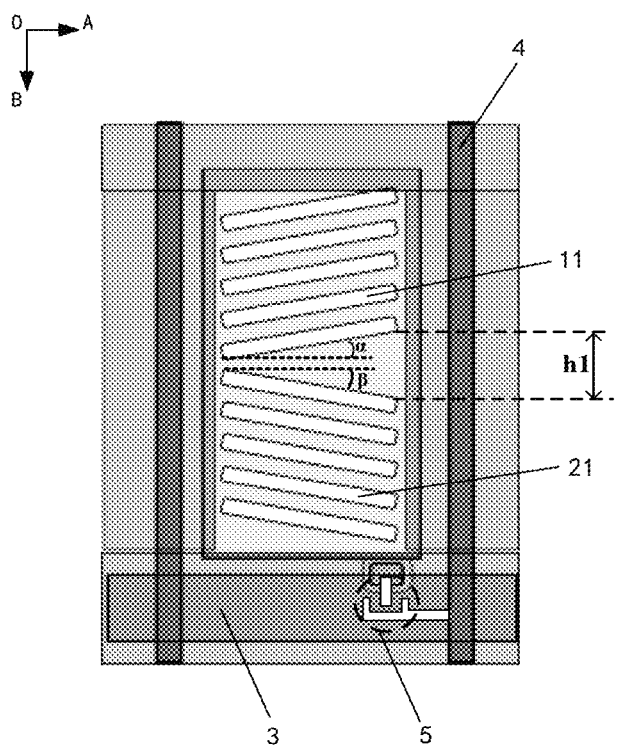
FIG. 3 is a schematic structural diagram of a third display panel according to an embodiment of the present disclosure.

Optionally, referring to FIG. 3, in the sub-pixel, the included angle between the direction of extension of the first slits 11 and a second direction (the direction OA in FIG. 3)

is a first included angle α, and the included angle between the direction of extension of the second slits 21 and the second direction (the direction OA in FIG. 3) is a second included angle β, wherein the second direction is perpendicular to the first direction. The maximum width h1 of the first area hr the first direction (the direction OB in FIG. 3) is in a positive correlation with the first included angle α and the second included angle β, respectively.

The second direction may be the direction OB shown in FIG. 3, and, in this case the first direction may be the direction OA shown in FIG. 3. Alternatively, the second direction may also be the direction OA shown in FIG. 3, and, in this case, the first direction may be the direction OB shown in FIG. 3. They are not limited herein. All of the figures of the embodiments of the present disclosure illustrate by taking the case as an example in which the second direction is the direction OA and the first direction is the direction OB.

The maximum width h1 of the first area in the first direction is in a positive correlation with the first included angle α and the second included angle β, respectively. In other words, when the first included angle α is larger, then the maximum width h1 of the first direction in the first area is higher; in this case, the width of the dark-area light shielding part 6 in the first direction is required to be increased correspondingly. Likewise, when the second included angle β is larger, then the maximum width h1 of the first direction in the first area is higher; in this case, the width of the dark-area light shielding part 6 in the first direction is required to be increased correspondingly. As an example, when the first included angle α or the second included angle β is increased from 5° to 11°, then the width of the dark-area light shielding part 6 in the first direction is required to be increased by 8 μm, wherein the relative increasing amount is 1.3 μm/° (in other words, for every one degree that is added, the width of the dark-area light shielding part in the first direction is required to be increased by approximately 1.3 μm).

It should be noted that all of the width of the first slits 11, the distance between each of the adjacent first slits 11, the width of the second slits 21 and the distance between each of the adjacent second slits 21 influence the area of the displaying dark area, and accordingly influence the setting of the width of the dark-area light shielding part 6 in the first direction. Generally, when the width of the first slits 11 is higher, the distance between each of the adjacent first slits 11 is higher, the width of the second slits 21 is higher, and the distance between each of the adjacent second slits 21 is higher, then the width of the dark-area light shielding part 6 in the first direction is required to be set to be higher.

Figure 4:
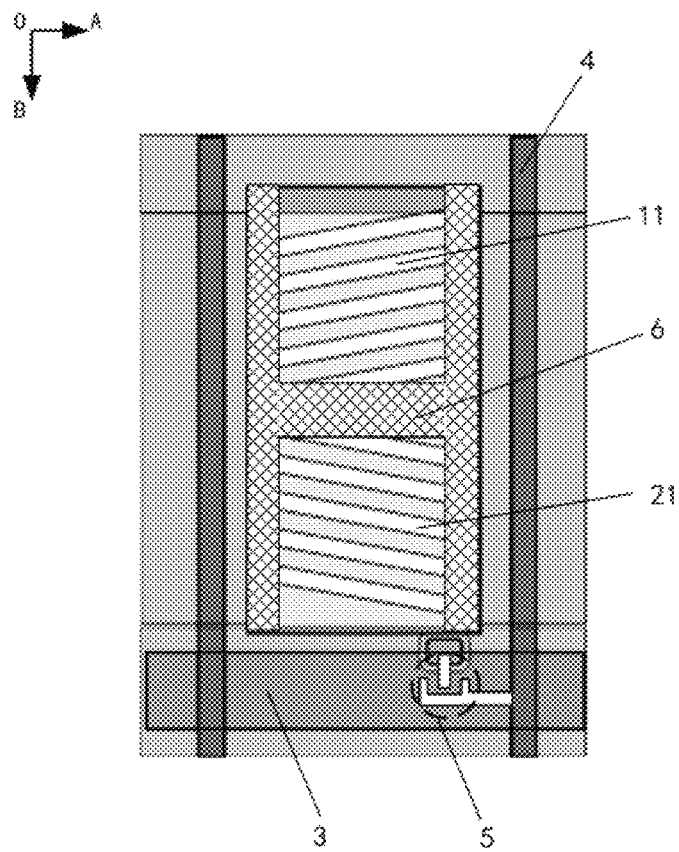
FIG. 4 is a schematic structural diagram of a fourth display panel according to an embodiment of the present disclosure.

Optionally, referring to FIG. 4, the orthographic projection of the dark-area light shielding part 6 on the substrate further covers the orthographic projection of a second area of the sub-pixel on the substrate, wherein the second area includes the areas where the two ends of each of the first slits 11 are located and the areas where the two ends of each of the second slits 21 are located.

Optionally, the second area further includes the areas between the same ends of each of the first slits 11 and of each of the second slits 21 and the edge of the adjacent sub-pixel.

The second area is also a displaying dark area, and, by blocking that area by using the dark-area light shielding part 6, the bright-state average brightness is further increased, thereby further increasing the contrast. FIG. 4 illustrates by taking the case as an example in which the orthographic projection of the dark-area light shielding part 6 on the substrate further covers the areas where the two ends of each of the first slits 11 are located, the areas where the two ends of each of the second slits 21 are located, and the areas between the same ends of each of the first slits 11 and of each of the second slits 21 and the edge of the adjacent sub-pixel.

An embodiment of the present disclosure provides a display panel, wherein the display panel includes a color-film base plate and the array base plate according to the above embodiments which are arranged in align with each other, and a liquid-crystal layer located between the color-film base plate and the array base plate.

The display panel may be an ADS-type display panel, may also be an HADS-type display panel, and may also be any products or components with a displaying function that include the display panel, such as a television set, a digital camera, a mobile phone and a tablet personal computer. The contrast of the display panel is greatly increased, to make a good effect of displaying, which may satisfy the market requirements.

An embodiment of the present disclosure provides a display panel, wherein the display panel includes an array base plate and a color-film base plate which are arranged in align with each other.

The array base plate includes a substrate and a plurality of sub-pixels that are provided on the substrate and are arranged in an array. Referring to FIG. 1, each of the sub-pixels includes a first slit electrode 1 and a second slit electrode 2 that are arranged in a first direction. The first slit electrode 1 includes a plurality of first slits 11 that are arranged parallelly and separately, the second slit electrode 2 includes a plurality of second slits 21 that are arranged parallelly and separately, and the direction of extension of the first slits 11 and the direction of extension of the second slits 21 are different.

The color-film base plate includes a black matrix, and the black matrix includes a plurality of dark-area light shielding parts 6. Referring to FIGS. 2 and 5, the orthographic projection of the dark-area light shielding part 6 on the substrate at least partially covers the orthographic projection of a first area of the sub-pixel on the substrate, wherein the first area is the area between the first slit electrode 1 and the second slit electrode 2.

It should be noted that, in order to clearly demonstrate the structures of the first slit electrode 1 and the second slit electrode 2, the dark-area light shielding part 6 is not illustrated in FIG. 1.

The sub-pixel is generally configured as strip-shaped. The first direction may be the direction OB shown in FIG. 1 (i.e., the direction of the longer sides of the sub-pixel), and may also be the direction OA shown in FIG. 1 (i.e., the direction of the shorter sides of the sub-pixel), which is not limited herein. FIG. 1 illustrates by taking the case as an example in which the first direction is the direction OB.

The plurality of sub-pixels that are arranged in an array may include red-color (R) sub-pixels, green-color (G) sub-pixels and blue-color (B) sub-pixels, and certainly, the plurality of sub-pixels may further include sub-pixels of other colors, such as yellow-color (Y) sub-pixels.

That the orthographic projection of the dark-area light shielding part 6 on the substrate at least partially covers the orthographic projection of the first area of the sub-pixel on the substrate refers to that the orthographic projection of the dark-area light shielding part 6 on the substrate may partially cover the orthographic projection of the first area of the sub-pixel on the substrate, and may also totally cover the orthographic projection of the first area of the sub-pixel on the substrate. In addition, due to the direction of extension of the first slits 11 and the direction of extension of the second slits 21 are different, the shape of the area between the first slit electrode 1 and the second slit electrode 2 is irregular, and accordingly, referring to FIG. 2, the orthographic projection of the dark-area light shielding part 6 on the substrate may partially cover the orthographic projections of the first slits 11 and the second slits 21 that are adjacent to the first area on the substrate.

The orthographic projection of the dark-area light shielding part 6 on the substrate refers to the projection of the dark-area light shielding part 6 on the substrate in the direction perpendicular to the substrate. The orthographic projection of the first area of the sub-pixel on the substrate refers to the projection of the first area of the sub-pixel on the substrate in the direction perpendicular to the substrate.

The first slit electrode 1 and the second slit electrode 2 are electrically connected, and, in order to simplify the process, they may be manufactured by using a one-step patterning process. The quantity of the first slits 11 included in the first slit electrode 1 and the quantity of the second slits 21 included in the second slit electrode 2 are not limited herein.

The sub-pixel may further include a planar electrode located under the first slit electrode 1 and the second slit electrode 2. When the planar electrode is electrically connected to a common-electrode signal line, and the first slit electrode 1 and the second slit electrode 2 are electrically connected to a pixel-electrode signal line, the planar electrode is a common electrode, the first slit electrode 1 and the second slit electrode 2 are pixel electrodes, the array base plate formed in this case is an ADS-type array base plate, and the display panel is an ADS-type display panel. When the planar electrode is electrically connected to a pixel-electrode signal line, and the first slit electrode 1 and the second slit electrode 2 are electrically connected to a common-electrode signal line, the planar electrode serves as a pixel electrode, the first slit electrode 1 and the second slit electrode 2 are common electrodes, the array base plate formed in this case is an HADS-type array base plate, and the display panel is an HADS-type display panel. The type of the signal line electrically connected to the first slit electrode 1 and the second slit electrode 2 is not limited herein, and may be particularly determined according to practical demands.

In the display panel, after the first slit electrode 1, the second slit electrode 2 and the planar electrode are connected with a voltage, the first slit electrode 1 and the second slit electrode 2 generate an electric field at the edges of the slits, and at the same time, the first slit electrode 1 and the second slit electrode 2 generate an electric field with the planar electrode, respectively, thereby forming a multi-dimensional electric field, to drive the liquid-crystal molecules to rotate, to implement the displaying.

However, due to the direction of extension of the first slits 11 of the first slit electrode 1 and the direction of extension of the second slits 21 of the second slit electrode 2 are different in the sub-pixel, the liquid-crystal molecules corresponding to the area between the first slit electrode 1 and the second slit electrode 2 (i.e., the boundary area) may not be deviated to the suitable position. Therefore, the bright-state brightness of that area is obviously less than the bright-state brightness of the other areas, thereby forming a displaying dark area. However, the dark-state brightness of that area is equal to the dark-state brightness of the other areas.

In view of that, the black matrix of the color-film base plate is provided with the dark-area light shielding part 6, and the orthographic projection of the dark-area light shielding part 6 on the substrate at least partially covers the orthographic projection of the first area of the sub-pixel on the substrate, thereby blocking at least part of the first area, which may increase the average brightness of the sub-pixel, while maintaining the dark-state average brightness unchanged. Moreover, the contrast is defined as the quotient obtained by dividing the bright-state average brightness by the dark-state average brightness, and accordingly the contrast of the display panel is greatly increased, to make a good effect of displaying, thereby satisfying the market requirements.

The average value of the contrasts (CR) of the MNT ADS products in the related art is approximately 1000, and some of the products might be slightly less than 1000. By using the above-described solutions, the contrast may be increased by 3-6%. Moreover, the materials and the process conditions are not required to be modified, and the CR specification may be implemented by merely alteration of design. Moreover, the above-described solutions may be compatible with processes such as amorphous silicon (a-si) TFT, Oxide TFT, and low-temperature polycrystalline silicon (LTPS) TFT.

Figure 6:
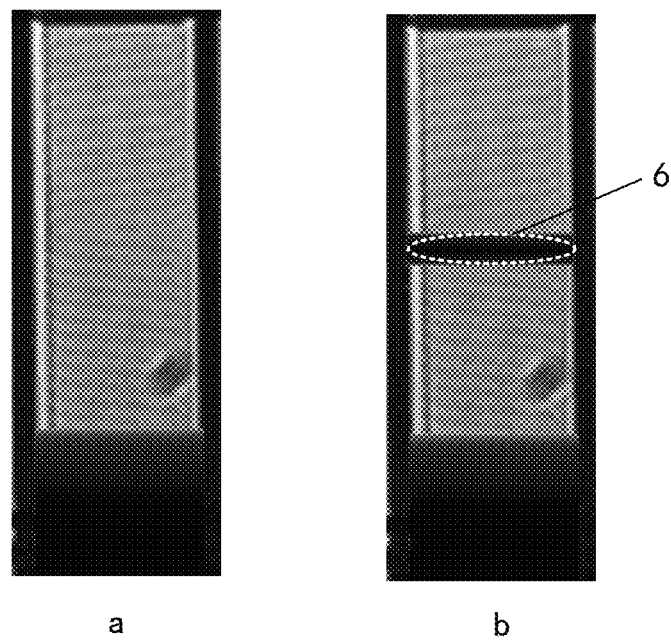
FIG. 6 is a comparison diagram of the photographs of the sub-pixel according to an embodiment of the present disclosure.

By taking a QHD ADS type display panel of 31.5 inches as an example, FIG. a in FIG. 6 is a photograph of a sub-pixel that is not provided with the dark-area light shielding part 6, and FIG. b in FIG. 6 is a photograph of a sub-pixel that is provided with the dark-area light shielding part 6. The dark-area light shielding part 6 blocks the boundary between the first slit electrode 1 and the second slit electrode 2, and the width of the dark-area light shielding part 6 in the vertical direction is 14 μm. It is obtained by calculation that the transmittance (Tr) is reduced from 4.3% to 4.1%, wherein the relative proportion of the reduction is approximately 5%, and the contrast (CR) is increased from 1064 to 1123, wherein the relative proportion of the increasing is approximately 6%.

It should be noted that the present embodiment differs from the above embodiments in that the position of the dark-area light shielding part 6 is different. In the above embodiments, the dark-area light shielding part 6 is provided in the array base plate, while, in the present embodiment, the dark-area light shielding part 6 is provided in the black matrix of the color-film base plate. Accordingly, based on the original processes, merely the designed pattern of the black matrix is required to be modified, and the materials and the process conditions are not required to be modified which facilitates extensive usage.

In order to facilitate the manufacturing, optionally, referring to FIG. 2, the width h of the dark-area light shielding part 6 in the first direction (the direction OB in FIG. 2) is uniform. In this case, the dark-area light shielding part 6 is an extending-throughout crossbar, to block the displaying dark area (also referred to as a weak-light-emission area) in the sub-pixel, thereby increasing the average brightness of the entire sub-pixel.

Optionally, referring to FIG. 2, the width h of the dark-area light shielding part 6 in the first direction (the direction OB in FIG. 2) is less than or equal to the sum of the aligning deviation between the array base plate and the color-film base plate and the maximum width h1 of the first area in the first direction (the direction OB in FIG. 2). In this case, it is obtained by software simulation that the range of the width of the dark-area light shielding part in the first direction is generally 10-26 μm. That may ensure that the affection on the transmittance (Tr) is reduced to the largest extent while increasing the contrast (CR). It should be noted that, when the aligning deviation between the array base plate and the color-film base plate is higher, and the maximum width of the first direction in the first area is higher, then the width of the dark-area light shielding part in the first direction is required to be set to be higher.

Optionally, referring to FIG. 3, in the sub-pixel, the included angle between the direction of extension of the first slits 11 and a second direction (the direction OA in FIG. 3) is a first included angle α, and the included angle between the direction of extension of the second slits 21 and the second direction (the direction OA in FIG. 3) is a second included angle β, wherein the second direction is perpendicular to the first direction. The maximum width h1 of the first area in the first direction (the direction OB in FIG. 3) is in a positive correlation with the first included angle α and the second included angle β, respectively.

The second direction may be the direction OB shown in FIG. 3, and, in this case, the first direction may be the direction OA shown in FIG. 3. Alternatively, the second direction may also be the direction OA shown in FIG. 3, and, in this case, the first direction may be the direction OB shown in FIG. 3. They are not limited herein. All of the figures of the embodiments of the present disclosure illustrate by taking the case as an example in which the second direction is the direction OA and the first direction is the direction OB.

The maximum width h1 of the first area in the first direction is in a positive correlation with the first included angle α and the second included angle β, respectively. In other words, when the first included angle α is larger, then the maximum width h1 of the first direction in the first area is higher; in this case, the width of the dark-area light shielding part 6 in the first direction is required to be increased correspondingly. Likewise, when the second included angle is larger, then the maximum width h1 of the first direction in the first area is higher; in this case, the width of the dark-area light shielding part 6 in the first direction is required to be increased correspondingly. As an example, when the first included angle α or the second included angle β is increased from 5° to 11°, then the width of the dark-area light shielding part 6 in the first direction is required to be increased by 8 μm, wherein the relative increasing amount is 1.3 μm/° (in other words, for every one degree that is added, the width of the dark-area light shielding part in the first direction is required to be increased by approximately 1.3 μm).

It should be noted that all of the width of the first slits 11, the distance between each of the adjacent first slits 11, the width of the second slits 21 and the distance between each of the adjacent second slits 21 influence the area of the displaying dark area, and accordingly influence the setting of the width of the dark-area light shielding part 6 in the first direction. Generally, when the width of the first slits 11 is higher, the distance between each of the adjacent first slits 11 is higher, the width of the second slits 21 is higher, and the distance between each of the adjacent second slits 21 is higher, then the width of the dark-area light shielding part 6 in the first direction is required to be set to be higher.

Referring to FIG. 2, the array base plate further includes a plurality of grid lines 3 that are arranged in the first direction. The grid lines are located between two adjacent rows of the sub-pixels in the first direction. The black matrix further includes a grid-line light shielding part (not shown in FIG. 3), and the orthographic projections of the grid-line light shielding part on the substrate cover the orthographic projections of the grid lines 3 on the substrate. The proportion of the width h of the dark-area light shielding part 6 in the first direction is less than or equal to one-half of the width of the grid-line light shielding part in the first direction. It should be noted that the width of the grid-line light shielding part in the first direction is greater than or equal to the width h2 of the grid lines in the first direction. That may ensure that the affection on the transmittance (Tr) is reduced to the largest extent while increasing the contrast (CR).

Optionally, referring to FIG. 4, the orthographic projection of the dark-area light shielding part 6 on the substrate further covers the orthographic projection of a second area of the sub-pixel on the substrate, wherein the second area includes the areas where the two ends of each of the first slits 11 are located and the areas where the two ends of each of the second slits 21 are located.

Optionally, the second area further includes the areas between the same ends of each of the first slits 11 and of each of the second slits 21 and the edge of the adjacent sub-pixel.

The second area is also a displaying dark area, and, by blocking that area by using the dark-area light shielding part 6, the bright-state average brightness is further increased, thereby further increasing the contrast. As an example, the dark-area light shielding parts of a width of 1.9 μm are provided at the two ends of each of the first slits 11 and each of the second slits 21, respectively, and it is obtained by actual measurement that the contrast is increased by 1% and the transmittance is reduced by 3%.

FIG. 4 illustrates by taking the case as an example in which the orthographic projection of the dark-area light shield part 6 on the substrate further covers the areas where the two ends of each of the first slits 11 are located, the areas where the two ends of each of the second slits 21 are located, and the areas between the same ends of each of the first slits 11 and of each of the second slits 21 and the edge of the adjacent sub-pixel.

In order to prevent light leakage and improve the effect of displaying, referring to FIG. 3, the array base plate further includes a plurality of data lines 4 and thin-film transistors 5 that are arranged in the second direction (the direction OA in FIG. 3). The data lines are located between two adjacent rows of the sub-pixels in the second direction. The thin-film transistors are electrically connected to the first slit electrode 1 and the second slit electrode 2. The black matrix (BM) further covers the data lines 4 and the thin-film transistors 5. Certainly, the black matrix may also cover the other areas, which are not listed herein.

The above are merely particular embodiments of the present disclosure, and the protection scope of the present disclosure is not limited thereto. All of the variations or substitutions that a person skilled in the art may easily envisage within the technical scope disclosed by the present disclosure should fall within the protection scope of the present disclosure. Therefore, the protection scope of the present disclosure should be subject to the protection scope of the claims.

The invention claimed is:

1. An array base plate, wherein the array base plate comprises a substrate and a plurality of sub-pixels that are provided on the substrate and are arranged in an array;
    each of the sub-pixels comprises a first slit electrode and a second slit electrode that are arranged in a first direction;
    the first slit electrode comprises a plurality of first slits that are arranged parallelly and separately, the second slit electrode comprises a plurality of second slits that are arranged parallelly and separately, and a direction of extension of the first slits and a direction of extension of the second slits are different; and
    the sub-pixel further comprises a dark-area light shielding part located over the first slit electrode and the second slit electrode, and an orthographic projection of the dark-area light shielding part on the substrate at least partially covers an orthographic projection of a first area of the sub-pixel on the substrate, wherein the first area is an area between the first slit electrode and the second slit electrode;

wherein the array base plate further comprises a plurality of grid lines that are arranged in the first direction, and the grid lines are located between two adjacent rows of the sub-pixels in the first direction;

the sub-pixel further comprises a grid-line light shielding part, and the orthographic projection of the grid-line light shielding part on the substrate covers the orthographic projection of the grid line on the substrate;

wherein a width of the dark-area light shielding part in the first direction is less than or equal to one-half of a width of the grid-line light shielding part in the first direction; and wherein the width of the dark-area light shielding part in the first direction is less than or equal to a maximum width of the first area in the first direction;

wherein in the sub-pixel, an included angle between the direction of extension of the first slits and a second direction is a first included angle, and an included angle between the direction of extension of the second slits and the second direction is a second included angle, wherein the second direction and the first direction are perpendicular; and the maximum width of the first area in the first direction is correlated with the first included angle and the second included angle.

2. The array base plate according to claim 1, wherein the width of the dark-area light shielding part in the first direction is uniform.

3. The array base plate according to claim 1, wherein the width of the dark-area light shielding part in the first direction is correlated with a width of the first slits, a distance between each of the adjacent first slits, a width of the second slits and a distance between each of the adjacent second slits.

4. The array base plate according to claim 1, wherein the orthographic projection of the dark-area light shielding part on the substrate further covers an orthographic projection of a second area of the sub-pixel on the substrate, the second area comprises areas where two ends of each of the first slits are located and areas where two ends of each of the second slits are located.

5. The array base plate according to claim 4, wherein the second area further comprises areas between the same ends of each of the first slits and of each of the second slits and an edge of the adjacent sub pixel.

6. The array base plate according to claim 1, wherein the sub-pixel further comprises a planar electrode located under the first slit electrode and the second slit electrode.

7. The array base plate according to claim 6, wherein when the planar electrode is electrically connected to a common-electrode signal line, and the first slit electrode and the second slit electrode are electrically connected to a pixel-electrode signal line, the planar electrode is a common electrode, the first slit electrode and the second slit electrode are pixel electrodes, and the formed array base plate is an ADS-type array base plate.

8. The array base plate according to claim 6, wherein when the planar electrode is electrically connected to a pixel-electrode signal line, and the first slit electrode and the second slit electrode are electrically connected to a common-electrode signal line, the planar electrode is a pixel electrode, the first slit electrode and the second slit electrode are common electrodes, and the formed array base plate is an HADS-type array base plate.

9. A display panel, wherein the display panel comprises a color-film base plate and an array base plate which are arranged in align with each other, and a liquid-crystal layer located between the color-film base plate and the array base plate, wherein the array base plate comprises a substrate and a plurality of sub-pixels that are provided on the substrate and are arranged in an array;

each of the sub-pixels comprises a first slit electrode and a second slit electrode that are arranged in a first direction;

the first slit electrode comprises a plurality of first slits that are arranged parallelly and separately, the second slit electrode comprises a plurality of second slits that are arranged parallelly and separately, and a direction of extension of the first slits and a direction of extension of the second slits are different; and the sub-pixel further comprises a dark-area light shielding part located over the first slit electrode and the second slit electrode, and an orthographic projection of the dark-area light shielding part on the substrate at least partially covers an orthographic projection of a first area of the sub-pixel on the substrate, wherein the first area is an area between the first slit electrode and the second slit electrode;

wherein the array base plate further comprises a plurality of grid lines that are arranged in the first direction, and the grid lines are located between two adjacent rows of the sub-pixels in the first direction;

the sub-pixel further comprises a grid-line light shielding part, and the orthographic projection of the grid-line light shielding part on the substrate covers the orthographic projection of the grid line on the substrate; and wherein a width of the dark-area light shielding part in the first direction is less than or equal to one-half of a width of the grid-line light shielding part in the first direction; and wherein the width of the dark-area light shielding part in the first direction is less than or equal to a maximum width of the first area in the first direction;

wherein in the sub-pixel, an included angle between the direction of extension of the first slits and a second direction is a first included angle, and an included angle between the direction of extension of the second slits and the second direction is a second included angle, wherein the second direction and the first direction are perpendicular; and the maximum width of the first area in the first direction is correlated with the first included angle and the second included angle.

10. The displaying panel according to claim 9, wherein the width of the dark-area light shielding part in the first direction is uniform.

11. The display panel according to claim 9, wherein the width of the dark-area light shielding part in the first direction is less than or equal to a sum of an aligning deviation between the array base plate and the color-film base plate and the maximum width of the first area in the first direction.

12. A display panel, wherein the display panel comprises an array base plate and a color-film base plate which are arranged in align with each other;

the array base plate comprises a substrate and a plurality of sub-pixels that are provided on the substrate and are arranged in an array, each of the sub-pixels comprises a first slit electrode and a second slit electrode that are arranged in a first direction, the first slit electrode comprises a plurality of first slits that are arranged parallelly and separately, the second slit electrode comprises a plurality of second slits that are arranged parallelly and separately, and a direction of extension of the first slits and a direction of extension of the second slits are different; and the color-film base plate comprises a black matrix, the black matrix comprises a plurality of dark-area light shielding parts, and an orthographic projection of the dark-area light shielding part on the substrate at least partially covers an orthographic projection of a first area of the sub-pixel on the substrate, wherein the first area is an area between the first slit electrode and the second slit electrode;

wherein the array base plate further comprises a plurality of grid lines that are arranged in the first direction, and the grid lines are located between two adjacent rows of the sub-pixels in the first direction;

the black matrix further comprises a grid-line light shielding part, and the orthographic projection of the grid-line light shielding part on the substrate covers the orthographic projection of the grid line on the substrate;

wherein a width of the dark-area light shielding part in the first direction is less than or equal to one-half of a width of the grid-line light shielding part in the first direction;

wherein the width of the dark-area light shielding part in the first direction is less than or equal to a sum of an aligning deviation between the array base plate and the color-film base plate and a maximum width of the first area in the first direction;

wherein in the sub-pixel, an included angle between the direction of extension of the first slits and a second direction is a first included angle, and an included angle between the direction of extension of the second slits and the second direction is a second included angle, wherein the second direction and the first direction are perpendicular; and the maximum width of the first area in the first direction is correlated with the first included angle and the second included angle.

13. The display panel according to claim 12, wherein the width of the grid-line light shielding part in the first direction is greater than or equal to a width of the grid lines in the first direction.

14. The display panel according to claim 12, wherein the orthographic projection of the dark-area light shielding part on the substrate further covers an orthographic projection of a second area of the sub-pixel on the substrate, wherein the second area comprises areas where two ends of each of the first slits are located and areas where two ends of each of the second slits are located.

15. The display panel according to claim 14, wherein the second area further comprises areas between the same ends of each of the first slits and of each of the second slits and an edge of the adjacent sub-pixel.

16. The display panel according to claim 12, wherein the array base plate further comprises a plurality of data lines and thin-film transistors that are arranged in a second direction;

the data lines are located between two adjacent rows of the sub-pixels in the second direction, and the thin-film transistors are electrically connected to the first slit electrode and the second slit electrode; and the black matrix covers the data lines and the thin-film transistors.

* * * * *